(12) United States Patent
Lee

(10) Patent No.: US 8,877,590 B1
(45) Date of Patent: Nov. 4, 2014

(54) SEMICONDUCTOR MEMORY DEVICE AND METHOD OF MANUFACTURING THE SAME

(71) Applicant: SK hynix Inc., Gyeonggi-do (KR)

(72) Inventor: Nam Jae Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/044,539

(22) Filed: Oct. 2, 2013

(30) Foreign Application Priority Data

Jun. 28, 2013 (KR) .................. 10-2013-0075217

(51) Int. Cl.
*H01L 27/088* (2006.01)
*H01L 29/792* (2006.01)
*H01L 29/66* (2006.01)

(52) U.S. Cl.
CPC ........ *H01L 29/792* (2013.01); *H01L 29/66666* (2013.01)
USPC 438/268; 257/324; 257/E27.06; 257/E21.645

(58) Field of Classification Search
USPC .............. 438/268; 257/324, E27.06, E21.645
See application file for complete search history.

(56) References Cited

U.S. PATENT DOCUMENTS

| 2010/0276743 | A1 | 11/2010 | Kuniya et al. | |
| 2012/0001250 | A1* | 1/2012 | Alsmeier | 257/319 |
| 2014/0008714 | A1* | 1/2014 | Makala et al. | 257/324 |

FOREIGN PATENT DOCUMENTS

KR    1020130123165    11/2013

* cited by examiner

*Primary Examiner* — Marc Armand
(74) *Attorney, Agent, or Firm* — IP & T Group LLP

(57) ABSTRACT

A semiconductor memory device and a method of manufacturing the same are provided. The device includes interlayer insulating patterns and conductive patterns stacked alternately, vertical channel layers formed through the interlayer insulating patterns and the conductive patterns, a tunnel insulating layer formed to surround sidewalls of each of the vertical channel layers, and a multifunctional layer formed to surround the tunnel insulating layer. The multifunctional layer includes trap regions disposed at intersections between the vertical channel layers and the conductive patterns, respectively, and disposed to be in contact with the tunnel insulating layer, blocking regions disposed to be in contact with the trap regions and the conductive patterns, and sacrificial regions disposed between adjacent ones of the blocking regions.

12 Claims, 12 Drawing Sheets

SEMICONDUCTOR MEMORY DEVICE AND METHOD OF MANUFACTURING THE SAME

CROSS-REFERENCE TO RELATED APPLICATION

The present application claims priority of Korean Patent Application No. 10-2013-0075217, filed on Jun. 28, 2013, the entire disclosure of which is incorporated herein by reference in its entirety.

BACKGROUND

1. Field of Invention

Embodiments of the present invention relate to a semiconductor device. More specifically, the embodiments of the present invention relate to a semiconductor memory device and a method of manufacturing the same.

2. Description of Related Art

A semiconductor memory device may include memory cells in which data may be stored. In general, the memory cells may be 2-dimensionally arranged within a limited area. In this case, to provide a high-capacity subminiature semiconductor memory device, the integration density of the memory cells may be increased by reducing the size of each of the memory cells.

The size of the memory cells may not be further reduced to a certain size to ensure reliability. Also, the size of the memory cells may not be further reduced due to the restrictions of a manufacturing process. As described above, there is a limit in reducing the size of the memory cells. To overcome the limitation while increasing the integration density of the memory cells within a limited area, a semiconductor memory device in which memory cells are 3-dimensionally arranged has been proposed.

A 3-dimensional semiconductor memory device may include word lines stacked on a substrate, apart from one another, a channel layer formed through the word lines ire a direction vertical to the substrate, a tunnel insulating layer formed to surround the channel layer, a charge storage layer formed to surround the tunnel insulating layer, and a blocking insulating layer formed to surround the charge storage layer. Memory cells may trap charges in a partial region of the charge storage layer disposed at intersections between the word lines and the channel layer to store data.

In the 3-dimensional semiconductor memory device, the charge storage layer may not be separated into respective memory cells but may be formed to surround the entire surfaces of sidewalls of the channel layer. Thus, charges stored in a specific memory cell may be transported to another memory cell along the charge storage layer. In this case, since it is difficult to ensure data retention characteristics, it may be difficult to ensure reliability of the 3-dimensional semiconductor memory device.

BRIEF SUMMARY

The present invention is directed to a semiconductor memory device and a method of manufacturing the same, which may prevent transport of charges between memory cells and improve reliability.

One aspect of the present invention provides a semiconductor memory device including interlayer insulating patterns and conductive patterns stacked alternately, vertical' channel layers formed through the interlayer insulating patterns and the conductive patterns, a tunnel insulating layer formed to surround sidewalls of each of the vertical channel layers, and a multifunctional layer formed to surround the tunnel insulating layer, wherein the multifunctional layer includes trap regions disposed at intersections between the vertical channel layers and the conductive patterns, respectively, and disposed to be in contact with the tunnel insulating layer, blocking regions disposed to be in contact with the trap regions and the conductive patterns, and sacrificial regions disposed between adjacent ones of the blocking regions.

Another aspect of the present invention provides a method of manufacturing a semiconductor memory device. The method includes alternately stacking interlayer insulating layers and sacrificial layers, forming holes through the interlayer insulating layers and the sacrificial layers, forming a preliminary layer, a tunnel insulating layer, and a channel layer within each of the holes, forming a slit between the holes through the interlayer insulating layers and the sacrificial layers, removing the sacrificial layers exposed through the slit to form recess regions, firstly processing the preliminary layer exposed through the recess regions, thereby defining trap regions in partial regions of the preliminary layer, secondly processing the preliminary layer disposed around the trap regions, thereby defining blocking regions contacting the trap regions in partial regions of the preliminary layer, and forming conductive patterns within the recess regions.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
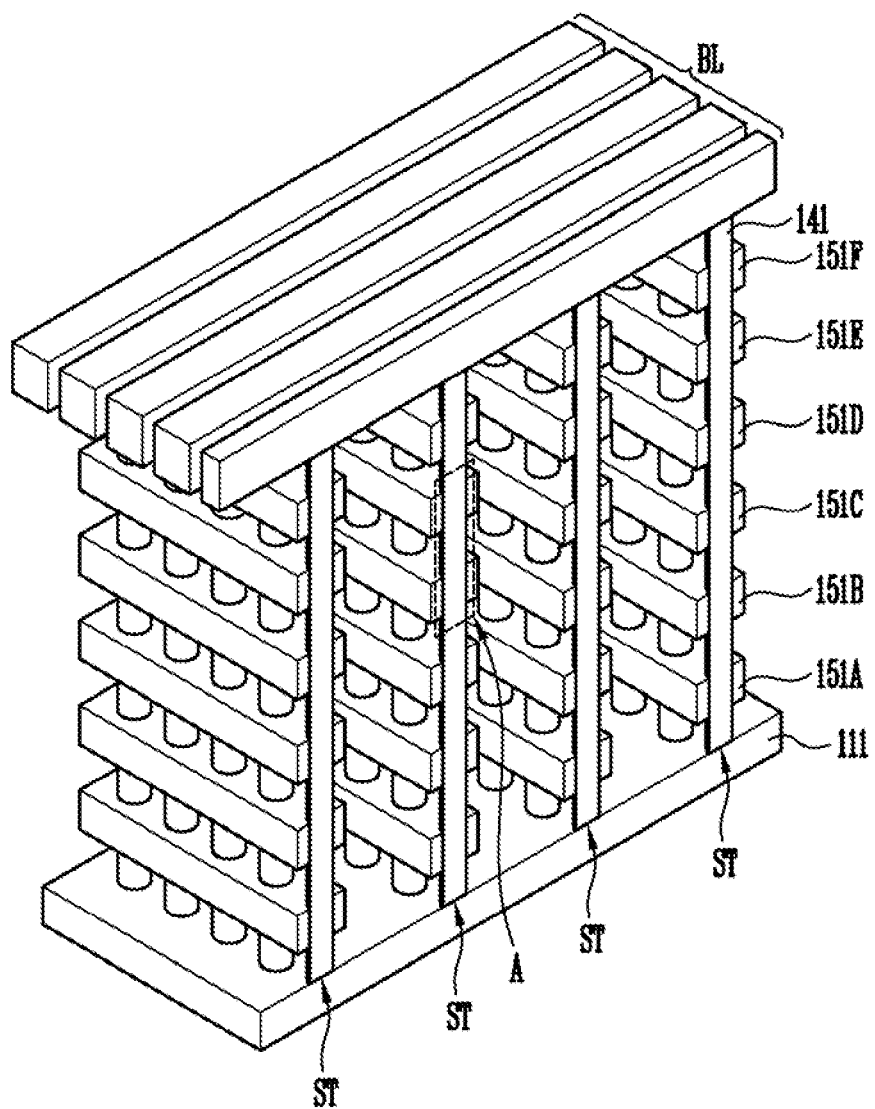
FIG. 1 is a perspective view of a semiconductor memory device according to an exemplary embodiment of the present invention.

The present invention will be described more fully hereinafter with reference to the accompanying drawings in which exemplary embodiments of the invention are shown. This invention may, however, be embodied in different forms and should not be construed as limited to the embodiments set forth herein. These embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

In the drawings, the thicknesses of layers and regions may be exaggerated compared to actual physical thicknesses for clarity. Descriptions of well-known components and processing techniques are omitted so as not to unnecessarily obscure the embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a perspective view of a semiconductor memory device according to an exemplary embodiment of the present invention. In FIG. 1, the illustration of an insulating layer is omitted for convenience of explanation.

Referring to FIG. 1, the semiconductor memory device according to the exemplary embodiment of the present invention may include a common source line 111 bit lines BL formed over the common source line 111, and cell strings ST disposed between the bit lines BL and the common source line 111.

The common source line 111 may be a conductive thin layer disposed on a semiconductor substrate or an impurity implantation region formed in the semiconductor substrate. The bit lines BL may be conductive lines spaced apart from the common source line 111 and disposed over the common source line 111. A plurality of cell strings ST may be connected to each of the bit lines BL, and the cell strings ST connected to each of the bit lines BL are disposed in parallel to one another. The cell strings ST connected to each of the bit lines BL may be connected in common to the common source line 111.

Each of the cell strings ST may be connected to conductive patterns 151A to 151F stacked apart from one another between the bit lines BL and the common source line 111. At least one conductive pattern (e.g., 151A) including the lowermost layer of the conductive patterns 151A to 151F may be used as a lower selection gate, while at least one conductive pattern (e.g., 151F) including the uppermost layer of the conductive patterns 151A to 151F may be used as an upper selection gate. Conductive patterns (e.g., 151B to 151E) between the lower selection gate and the upper selection gate may be used as memory cell gates. The conductive patterns 151A to 151F may form line patterns along a direction crossing the bit lines BL.

Each of the cell strings ST may include a through structure 141. The through structure 141 may be vertically formed from a top surface of the common source line 111 and connected to the bit line BL through the conductive patterns 151A to 151F. A lower selection transistor may be defined at an intersection between the through structure 141 and the conductive pattern (e.g., 151A) serving as the lower selection gate, and an upper selection transistor may be defined at an intersection between the through structure 141 and the conductive pattern (e.g., 151F) serving as the upper selection gate. Memory cell transistors may be defined at intersections between the through structure 141 and the conductive patterns (e.g., 151B to 151E) serving as the memory cell gates. The lower selection transistor, the memory cell transistors, and the upper selection transistor of each of the cell strings ST may be connected in series through the through structure 141.

Hereinafter, the through structure 141 will be described in further detail with reference to FIGS. 2A and 2B.

Figure 2A:
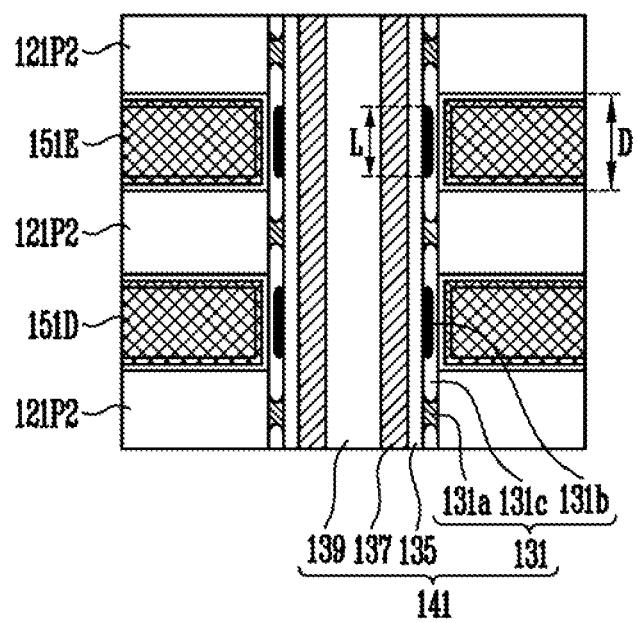
FIGS. 2A and 2B are enlarged cross-sectional views of region A shown in FIG. 1, which illustrate various examples of a through structure.
Figure 2B:
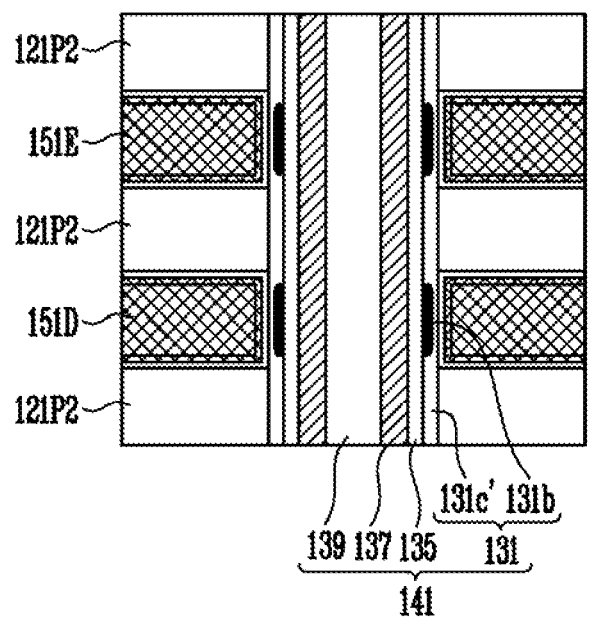

FIGS. 2A and 2B are enlarged cross-sectional views of region A shown in FIG. 1, which illustrate various examples of a through structure.

Referring to FIGS. 2A and 2B, the through structure 141 may include a vertical channel layer 137 formed through interlayer insulating patterns 121P2 and conductive patterns 151D and 151E, stacked alternately, a tunnel insulating layer 135 formed to surround sidewalls of the vertical channel layer 137, and a multifunctional layer 131 formed to surround the tunnel insulating layer 135. The vertical channel layer 137 may be formed of a semiconductor layer. As shown, the vertical channel layer 137 may be formed within a hole formed through the interlayer insulating patterns 121P2 and the conductive patterns 151D and 151E, stacked alternately. Here, the hole may have various plane shapes, such as a circular shape, an elliptical shape, and a polygonal shape. A central region of the vertical channel layer 137 may be filled with an insulating layer 139. Alternatively, although not shown, not only the surface of the vertical channel layer 137 but also the central region of the vertical channel layer 137 may be formed of a semiconductor layer.

Trap regions 131b and blocking regions 131c and 131c' may be defined in the multifunctional layer 131. The trap regions 131b may be spaced apart from one another in a direction in which the vertical channel layer 137 extends, and may be in contact with the tunnel insulating layer 135. The blocking regions 131c and 131c' may be in contact with the trap regions 131b and the conductive patterns 151D and 151E. A length L of each of the trap regions 131b disposed along the direction in which the vertical channel layer 137 extends, that is, a direction in which the interlayer insulating patterns 121P2 and the conductive patterns 151D and 151E are stacked, may be less or greater than a distance D between the interlayer insulating patterns 121P2 that are spaced apart, according to design specifications. Alternatively, the length L of each of the trap regions 131b may be equal to the distance D between the interlayer insulating patterns 121P2 that are spaced apart, according to design specifications.

The trap regions 131b may be formed at intersections between the conductive patterns 151D and 151E and the vertical channel layer 137 to surround and contact the tunnel insulating layer 135. The trap regions 131b may include silicon nitride. The trap regions 131b may trap charges and store data.

Each of the blocking regions 131c or 31c' may be in contact with top and bottom surfaces of each of the trap regions 131b, sidewalls of each of the trap regions 131b, which face the conductive patterns 151D and 151E, and sidewalls of the conductive patterns 151D and 151E. Thus, the blocking regions 131c or 131c' may electrically insulate the trap regions 131b from the conductive patterns 151D and 151E and electrically insulate the trap regions 131b from one another. The blocking regions 131c and 131c' may include silicon oxide.

As shown in FIG. 2A, the multifunctional layer 131 may further include sacrificial regions 131a. Each of the sacrificial regions 131a may be interposed between the blocking regions 131c and defined as a ring type to surround the tunnel insulating layer 135. The sacrificial regions 131a may be unnitrided or unoxidized regions, which may include silicon. The sacrificial regions 131a may be surrounded by the interlayer insulating patterns 121P2 and spaced apart from the trap regions 131b by the blocking regions 131c.

During an oxidation process for forming the blocking regions 131c', the entire region of the multifunctional layer 131 except the trap regions 131b may be defined as the blocking regions 131c' as shown in FIG. 2B.

In the exemplary embodiment as described above, since the trap regions 131b may be separated into cells by the blocking regions 131c and 131c', the transport of charges between memory cells may be prevented, thereby improving the reliability of the semiconductor memory device, FIGS. 3A through 3F are cross-sectional views illustrating a method of manufacturing the semiconductor memory device shown in FIG. 1.

Figure 3A:
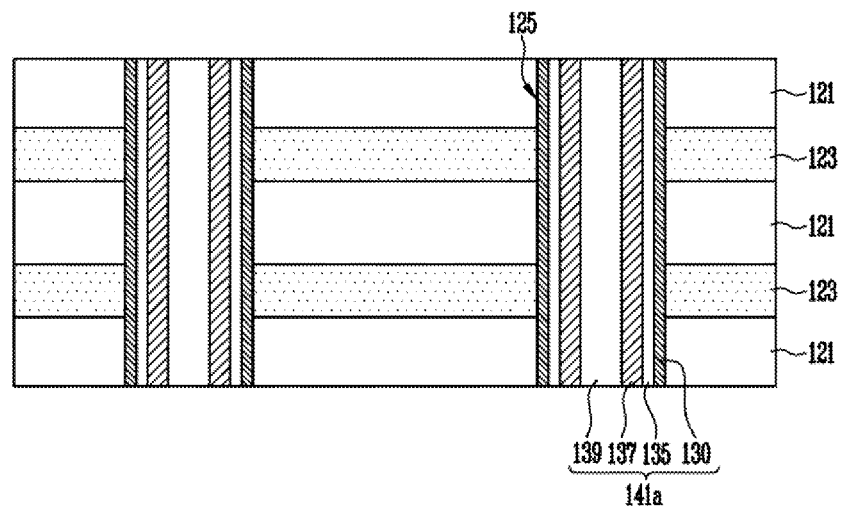
FIGS. 3A through 3F are cross-sectional views illustrating a method of manufacturing the semiconductor memory device shown in FIG. 1.

Referring to FIG. 3A, interlayer insulating layers 121 and sacrificial layers 123 may be alternately stacked on a semiconductor substrate (not shown) in which a common source line is formed. The interlayer insulating layers 121 may be formed of an oxide-based material, such as a silicon oxide layer. The sacrificial layers 123 may be formed of a material having an etch selectivity different from the interlayer insulating layers 121. For example, the sacrificial layers 123 may be formed of a silicon nitride layer. When an etching process for reducing the thickness of the interlayer insulating layers 121 is performed during a subsequent process, each of the interlayer insulating layers 121 may be formed to have a greater thickness than a thickness of each of the sacrificial layers 123.

Thereafter, the interlayer insulating layers 121 and the sacrificial layers 123 may be etched to form holes 125 through the interlayer insulating layers 121 and the sacrificial layers 123. Subsequently, a preliminary layer 130, a tunnel insulating layer 135, and a vertical channel layer 137 may be sequentially formed along sidewalls of each of the holes 125, thereby forming a preliminary through structure 141a. The preliminary layer 130 maybe formed of a silicon layer. The tunnel insulating layer 135 may be formed of a silicon oxide layer. The vertical channel layer 137 may be formed of a semiconductor layer, such as a silicon layer. The vertical channel layer 137 may be formed to fill a central region of each of the holes 125. Alternatively, the vertical channel layer 137 may be formed to open the central region of each of the holes 125. The opened central region of each of the holes 125 may be filled with an insulating layer 139.

Figure 3B:
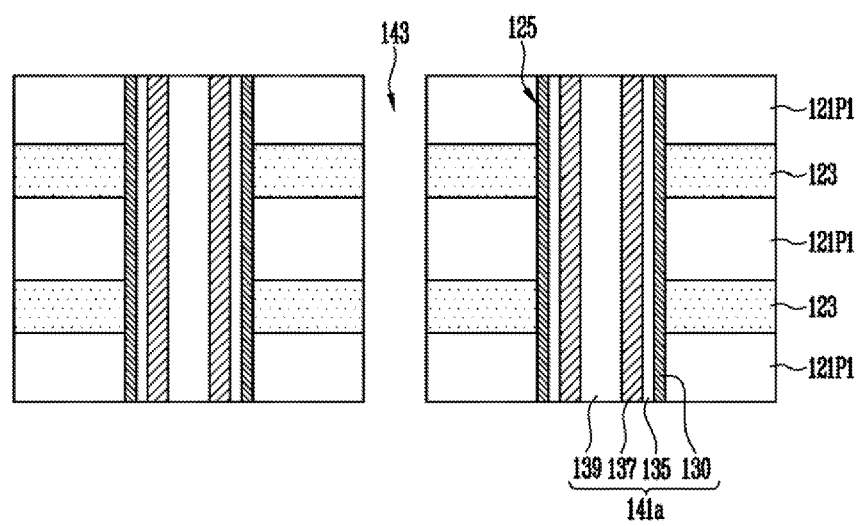

Referring to FIG. 3B, the interlayer insulating layers 121 and the sacrificial layers 123 disposed between the holes 125 may be etched to form a slit 143 between the holes 125, through the interlayer insulating layers 121 and the sacrificial layers 123. Due to the slit 143, a line-shaped preliminary interlayer insulating pattern 121P1 may be defined, and the sacrificial layers 123 may be exposed.

Figure 3C:
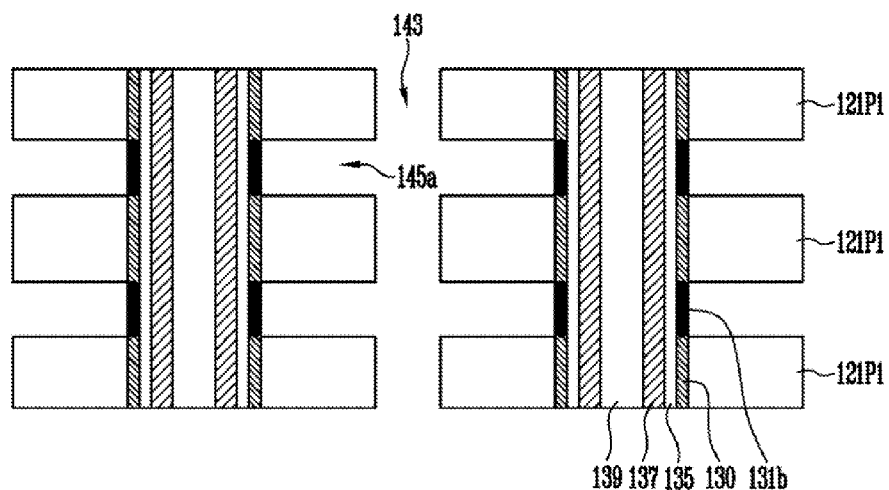

Referring to FIG. 3C, the sacrificial layers 123 exposed through the slit 143 may be selectively removed to form preliminary recess regions 145a between the preliminary interlayer insulating patterns 121P1 to expose partial regions of the preliminary layer 130.

Thereafter, the partial regions of the preliminary layer 130 exposed through the preliminary recess regions 145a may be firstly processed to define trap regions 131b. The first processing process may include nitriding the preliminary layer 130. Due to the first processing process, the trap regions 131b may turn into nitrided regions including silicon nitride. The trap regions 131b may be formed in the partial regions of the preliminary layer 130 to surround and contact the tunnel insulating layer 135. The trap regions 131b may be separated from one another and disposed in a direction in which the vertical channel layer 137 extends. The first processing process may be controlled so that partial regions of the preliminary layer 130, not exposed through the preliminary recess regions 145a and cut off by the preliminary interlayer insulating pattern 121P1, are not firstly processed but remain as regions (hereinafter, referred to as "non-trap regions") that are not defined as the trap regions 131b.

Figure 3D:
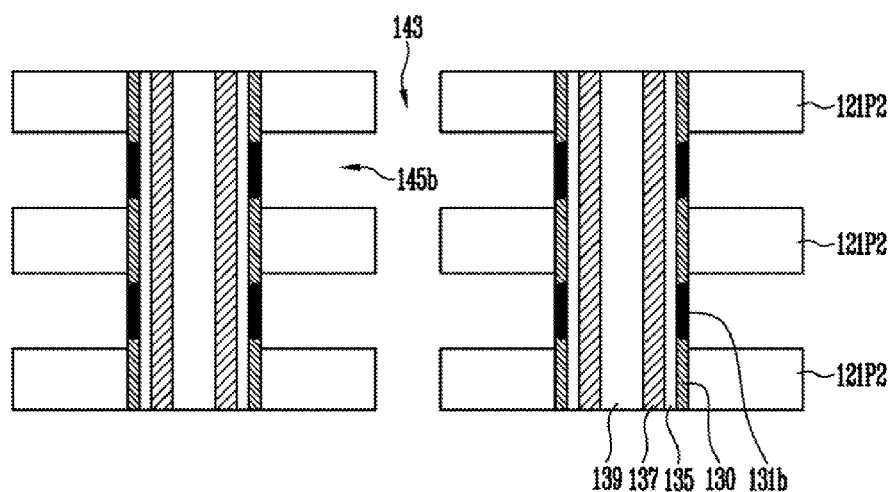

Referring to FIG. 3D, a cleaning process or an additional etching process may be performed to remove a portion of each of preliminary interlayer insulating patterns 121P1. Thus, interlayer insulating patterns 121P2 may be formed to have a smaller thickness than thicknesses of the preliminary interlayer insulating patterns 121P1. Between the interlayer insulating patterns 121P2, recess regions 145b may be defined to have a greater width than widths of the preliminary recess regions 145a, and the non-trap regions of the preliminary layer 130, which are not defined as the trap regions 131b, may be exposed. The thickness of the preliminary interlayer insulating patterns 121P1 may be reduced so that a material (e.g., an oxidation gas) for a second processing process may easily diffuse into the non-trap regions of the preliminary layer 130. Even if the thickness of the preliminary interlayer insulating patterns 121P1 is not reduced, as long as the non-trap regions of the preliminary layer 130 in contact with the trap regions 131b may be sufficiently secondly processed, the process described with reference to FIG. 3D may be omitted.

Figure 3E:
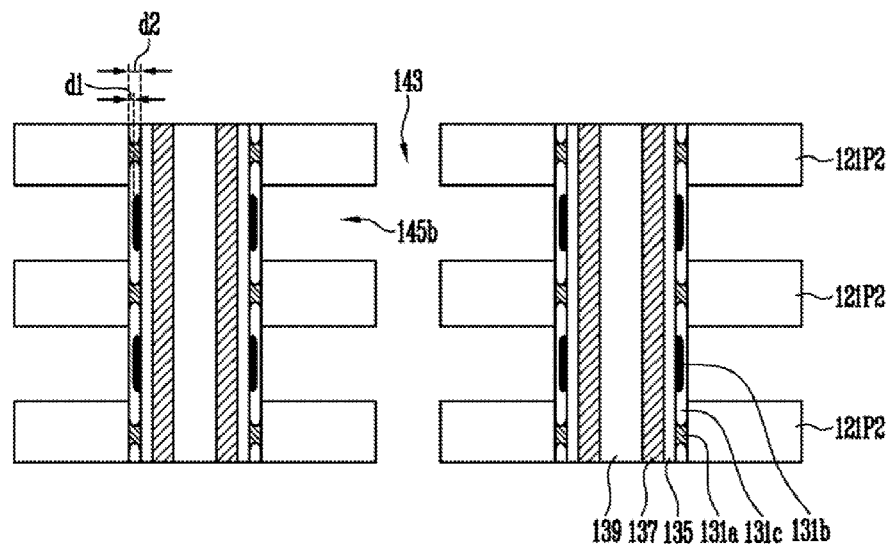

Referring to FIG. 3E, portions of the trap regions 131b exposed through the recess regions 145b and the non-trap regions of the preliminary layer 130 adjacent to the trap regions 131b may be secondly processed. Thus, blocking regions 131c in contact with the trap regions 131b may be defined in the preliminary layer 130.

The second processing process may include oxidizing the portions of the trap regions 131b and the non-trap regions of the preliminary layer 130 using an oxidation gas. The non-trap regions of the preliminary layer 130 may be oxidized at a higher speed than the trap regions 131b. Accordingly, an oxidized thickness d2 of each of the non-trap regions of the preliminary layer 130 may be greater than an oxidized thickness d1 of each of the trap regions 131b.

When the blocking regions 131c are formed using a difference in oxidation rate, for example, only a partial region of each of the trap regions 131b may be defined as a blocking region. Also, the blocking regions 131c may be defined to have a sufficient thickness to electrically insulate the trap regions 131b from one another. The oxidation process may be controlled so that portions of the trap regions 131b and the vertical channel layer 137 remain not oxidized. To this end, the oxidation process may be controlled so that a portion of the non-trap region of the preliminary layer 130 interposed between the trap regions 131b is not oxidized but remains as a sacrificial region 131a. The entire non-trap regions of the preliminary layer 130 may be oxidized to form blocking regions, as long as portions of the trap regions 131b and the vertical channel layer 137 remain not oxidized. The oxidation process may be variously modified by controlling an oxidation time, a gas composition, a pressure, and a temperature.

Figure 3F:
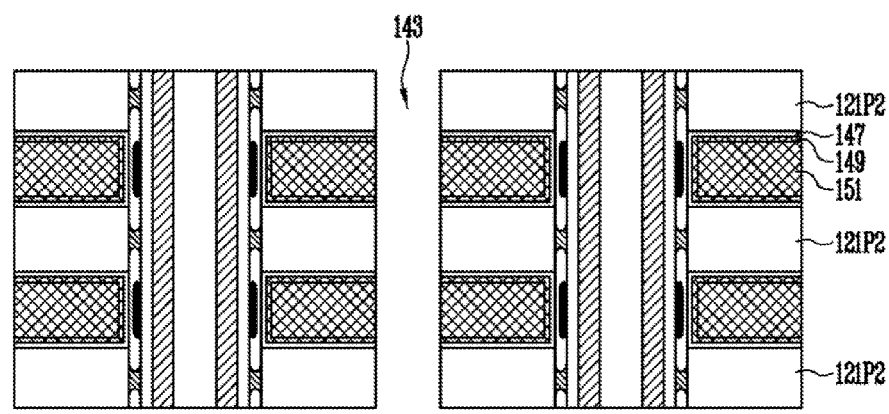

Referring to FIG. 3F, conductive patterns 151 may be formed within the recess regions 145b. The formation of the conductive patterns 151 may include forming a conductive layer to fill the recess regions 145b and removing the conductive layer formed within the slit 143. The conductive layer may be formed using a doped polysilicon (poly-Si) layer, a metal silicide layer, or a metal layer. When the conductive layer is formed using the metal layer, tungsten having a low resistance may be used. In this case, before the conductive layer is formed, a barrier layer 149 formed of, for example, titanium nitride (TiN), may be further formed to prevent diffusion of a metal. The barrier layer 149 formed within the slit 143 may be removed during the removal of the conductive layer formed within the slit 143.

Meanwhile, before the barrier layer 149 and the conductive layer are formed to form the conductive patterns 151, a blocking insulating layer 147 may be further formed along the surfaces of the recess regions 145b.

Subsequently, a known subsequent process, for example, a process of filling the slit 143 with an insulating material, may be performed.

In the exemplary embodiment as described above, partial regions of the preliminary layer 130 may be opened and defined as the trap regions 131b, and partial regions of the preliminary layer 130 in contact with the trap regions 131b may be defined as the blocking regions 131c. As a result, since the trap regions 131b may be separated into respective cells by the blocking regions 131c, the transport of charges between the memory cells may be prevented, thereby improving reliability of the semiconductor memory device.

In addition, in the exemplary embodiment of the present invention, since the partial regions of the preliminary layer 130 are defined as the trap regions 131b and the blocking regions 131c thereby forming the multifunctional layer 141, interfaces may not be formed between the trap regions 131b and the blocking regions 131c. Thus, in the exemplary embodiment of the present invention, concerns regarding degradation of reliability of the semiconductor memory device due to charges trapped at the interfaces between the trap regions 131b and the blocking regions 131c may be alleviated.

Figure 4:
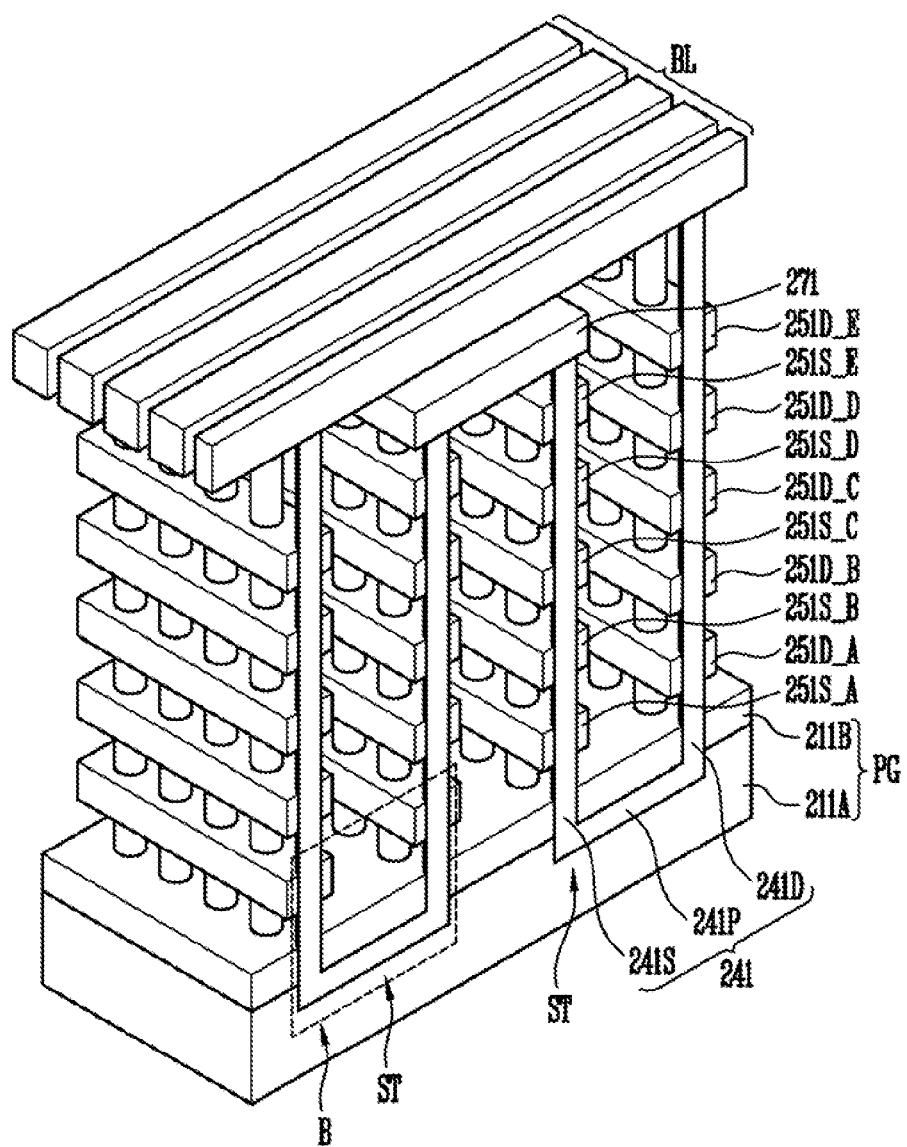
FIG. 4 is a perspective view of a semiconductor memory device according to an exemplary embodiment of the present invention.

FIG. 4 is a perspective view of a semiconductor memory device according to an exemplary embodiment of the present invention. In FIG. 4, the illustration of an insulating layer is omitted for convenience of explanation.

Referring to FIG. 4, the semiconductor memory device according to the exemplary embodiment of the present invention may include a pipe gate PG, a common source line 271 formed over the pipe gate PG, bit lines BL formed over the pipe gate PG, source-side conductive patterns 251S_A to 251S_E stacked apart from one another between the common source line 271 and the pipe gate PG, and drain-side conductive patterns 251D_A to 251D_E stacked apart from one another between the bit lines BL and the pipe gate PG. Also, the semiconductor memory device according to the exemplary embodiment of the present invention may include a through structure 241 formed through the source-side conductive patterns 251S_A to 251S_E, the pipe gate PG, and the drain-side conductive patterns 251D_A to 251D_E.

The through structure 241 may include a source-side through structure 241S and a drain-side through structure 241D, which may be parallel to each other, and a pipe through structure 241P formed to connect the source-side through structure 241S and the drain-side through structure 241D. The source-side through structure 241S may be connected to the common source line 271 and vertically extend to penetrate the source-side conductive patterns 251S_A to 251S_E. The drain-side through structure 241D may be connected to one of the bit lines BL and vertically extend to penetrate the drain-side conductive patterns 251D_A to 251D_E. The pipe through structure 241P may horizontally extend through the pipe gate PG and connect the source-side through structure 241S and the drain-side through structure 241D. Memory cells may be connected in series along the through structure 241 and constitute a cell string ST.

The pipe gate PG may be formed by stacking first and second pipe gates 211A and 211B. When the second pipe gate 211B is in contact with a top surface of the pipe through structure 241P, the drain-side through structure 241D and the source-side through structure 241S may further penetrate the second pipe gate 211B and be connected to the pipe through structure 241P.

The common source line 271 and the bit lines BL may be conductive lines and disposed in different layers apart from one another. For example, the bit lines BL may be formed on the common source line 271. The common source line 271 and the bit lines BL may extend and intersect each other. A plurality of cell strings ST may be connected to each of the bit lines BL, and the cell strings ST connected to each of the bit lines BL are disposed in parallel to one another. The cell strings ST connected to each of the bit lines BL may be connected in common to the common source line 271.

Each of the cell strings ST may be connected to drain-side conductive patterns 251D_A to 251D_E and source-side conductive patterns 251S_A to 251S_E. At least one conductive pattern (e.g., 251D_E) including the uppermost layer of the drain-side conductive patterns 251D_A to 251D_E may be used as a drain selection gate. Also, at least one conductive pattern (e.g., 251S_E) including the uppermost layer of the source-side conductive patterns 251S_A to 251S_E may be used as a source selection gate. Conductive patterns (e.g., 251S_A to 251S_D) disposed under the source selection gate and conductive patterns (e.g. 251D_A to 251D_D) disposed under the drain selection gate may be used as memory cell gates. The drain-side conductive patterns 251D_A to 251D_E and the source-side conductive patterns 251S_A to 251S_E may form line patterns along a direction crossing the bit lines BL.

As described above, each of the cell strings ST may include a through structure 241 connected between the common source line 271 and the bit line BL. A drain selection transistor may be defined at an intersection between the through structure 241 and the conductive pattern (e.g., 251D_E) serving as the drain selection gate, and a source selection transistor may be defined at an intersection between the through structure 241 and the conductive pattern (e.g., 251S_E) serving as the source selection gate. Memory cell transistors may be defined at intersections between the through structure 241 and the conductive patterns (e.g., 251S_A through 251S_D and 251D_A through 251D_D), respectively, serving as the memory cell gates. Furthermore a pipe transistor may be defined at an intersection between the through structure 241 and the pipe gate PG. The pipe transistor, the drain selection transistor, the memory cell transistors, and the source selection transistor of each of the cell strings ST may be connected in series through the through structure 241.

Hereinafter, the through structure 241 will be described in further detail with reference to FIG. 5.

Figure 5:
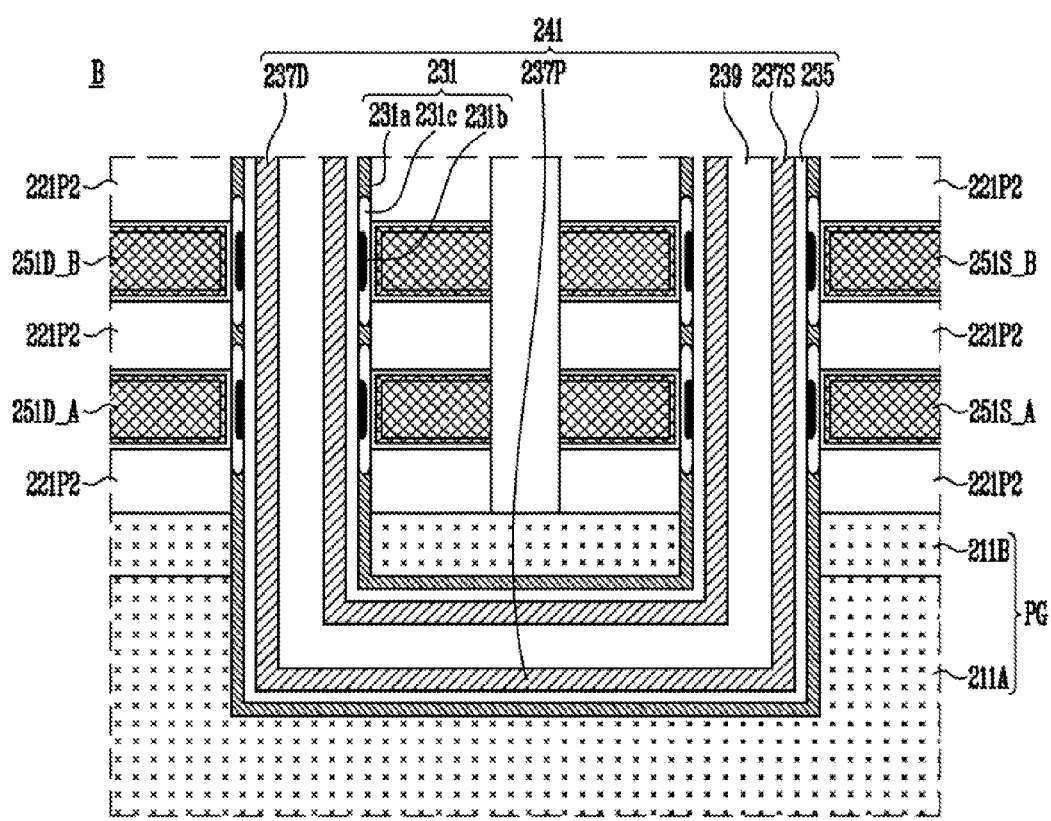
FIG. 5 is an enlarged cross-sectional view of region B shown in FIG. 4, which illustrates a through structure.

FIG. 5 is an enlarged cross-sectional view of region B shown in FIG. 4, which illustrates a through structure 241.

Referring to FIG. 5, the through structure 241 may include a channel structure including a drain-side vertical channel layer 237D, a source-side vertical channel layer 237S, and a pipe channel layer 237P formed to connect the drain-side vertical channel layer 237D and the source-side vertical channel layer 237S, a tunnel insulating layer 235 formed to surround side walls of the channel structure, and multifunctional layer 231 formed to surround the tunnel insulating layer 235. The drain-side vertical channel layer 237D may be formed through interlayer insulating patterns 221P2 and the drain-side conductive patterns 251D_A and 251D_B, which are stacked alternately. The source-side vertical channel layer 237S may be formed through the interlayer insulating patterns 221P2 and the source-side conductive patterns 251S_A and 251S_B, which are stacked alternately. The pipe channel layer 237P may connect the drain-side vertical channel layer 237D and the source-side vertical channel layer 237S, and be formed in the pipe gate PG.

The channel structure may be formed of a semiconductor layer. As shown, a central region of the channel structure may be filled with an insulating layer 239. Alternatively, both the surface and central region of the channel structure may be formed of a semiconductor layer.

Trap regions 231b and blocking regions 231c may be defined in the multifunctional layer 231. The trap regions 231b may be disposed apart from one another in a direction in which the drain-side vertical channel layer 237D and the source-side vertical channel layer 237S extend. The trap regions 231b may be in contact with the tunnel insulating layer 235. Some blocking regions 231c may be in contact with respective trap regions 231b and the drain-side conductive patterns 251D_A and 251D_B, and other blocking regions 231c may be in contact with respective trap regions 231b and the source-side conductive patterns 251S_A and 251S_B. The trap regions 231b and the blocking regions 231c may be formed in the same shapes as the shapes of the trap regions 131b and the blocking regions 131c, described above with reference to FIG. 2A. A partial region of the multifunctional layer 231 formed to surround the pipe channel layer 231P may be an unoxidized or unnitrided sacrificial region 231a. Since the trap region 231b is not defined in the pipe transistor, a driving voltage of the pipe transistor may be reduced, and the trapping of charges in the pipe transistor may be reduced. In addition, the sacrificial region 231a may be disposed in the multifunctional layer 231 to surround the tunnel insulating layer 235 between adjacent blocking regions 231c along a direction in which each of the drain-side vertical channel layer 237D and the source-side vertical channel layer 237S extends. The sacrificial regions 231a spaced apart from one another in the direction in which each of the drain-side vertical channel layer 237D and the source-side vertical channel layer 237S extends may be unnitrided or unoxidized regions. The sacrificial regions 231a may be surrounded by the interlayer insulating patterns 221P2 and spaced apart from the trap regions 231b by the blocking regions 231c.

FIGS. 6A through 6D are cross-sectional views illustrating a method of manufacturing the semiconductor memory device shown in FIG. 4.

Figure 6A:
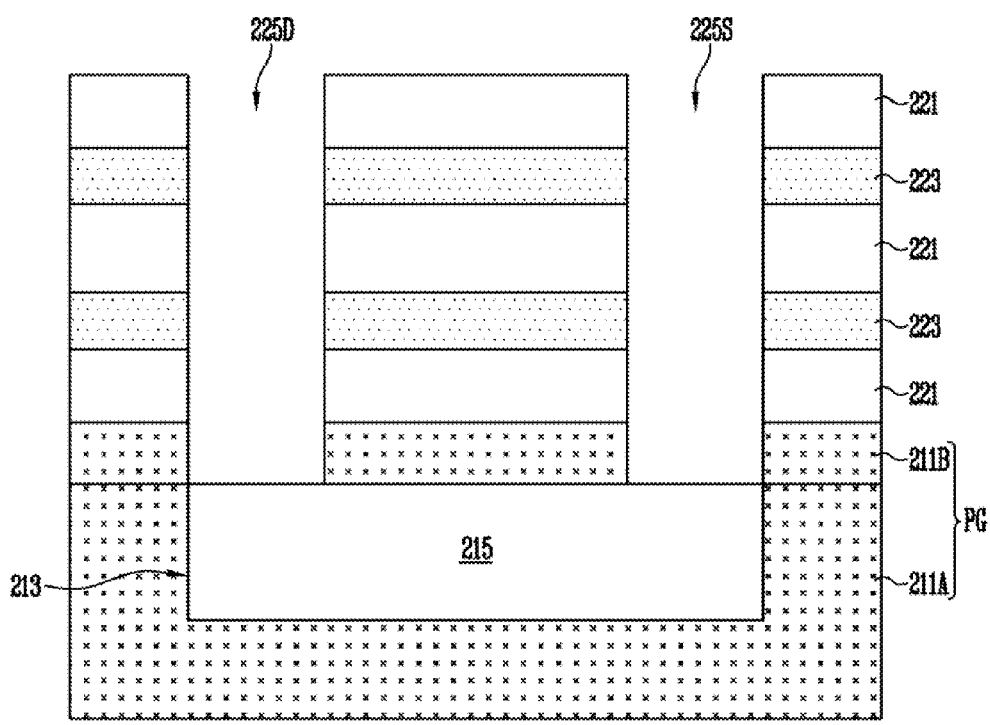
FIGS. 6A through 6D are cross-sectional views illustrating a method of manufacturing the semiconductor memory device shown in FIG. 4.

Referring to FIG. 6A, after a pipe trench 213 is formed in a first pipe gate 211A, the pipe trench 213 may be filled with a sacrificial layer 215. Thereafter, a second pipe gate 211B may be formed on the first pipe gate 211A filled with the sacrificial layer 215, and the first and second pipe gates 211A and 211B may be patterned to form a pipe gate PG. The first and second pipe gates 211A and 211B may be formed of a conductive layer. In the above-described process, the process of forming the second pipe gate 211B may be omitted.

Subsequently, interlayer insulating layers 221 and sacrificial layers 223 may be alternately stacked on the pipe gate PG. Materials forming the interlayer insulating layers 221 and the sacrificial layers 223 and thicknesses of the interlayer insulating layers 221 and the sacrificial layers 223 may be the same as those described above with reference to FIG. 3A.

Thereafter, the interlayer insulating layers 221 and the sacrificial layers 223 may be etched to form a drain-side hole 225D and a source-side hole 225S through the interlayer insulating layers 221 and the sacrificial layers 223. In this case, when the second pipe gate 211B is formed, the second pipe gate 211B may be further etched so that the sacrificial layer 215 disposed within the pipe trench 213 may be exposed through the drain-side hole 225D and the source-side hole 225S.

Figure 6B:
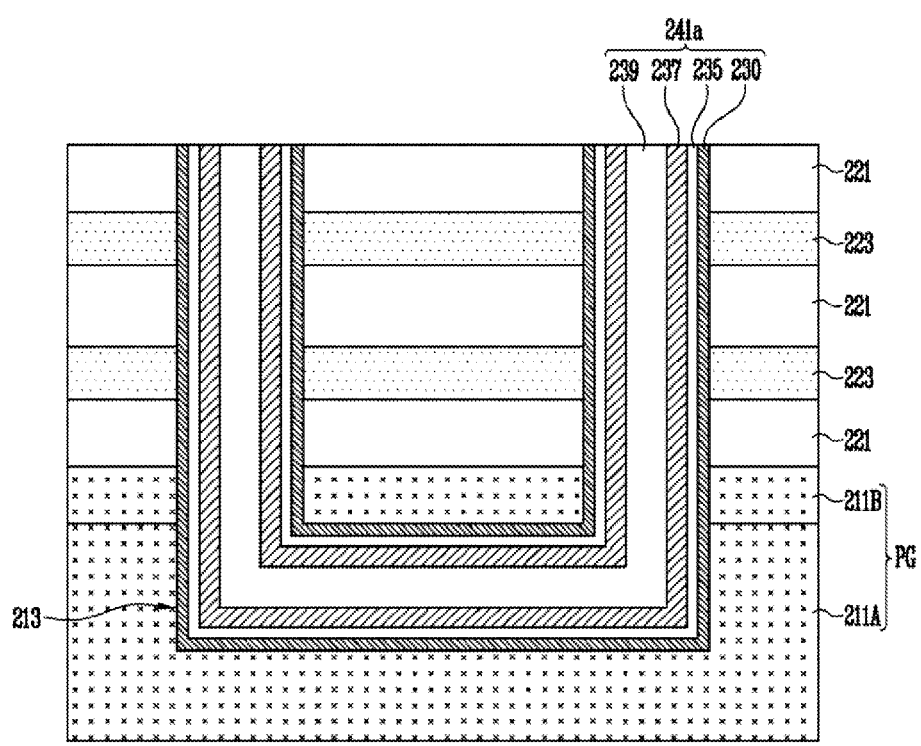

Referring to FIG. 6B, the sacrificial layer 215 disposed within the pipe trench 213 may be removed to open the pipe trench 213. Thereafter, a preliminary layer 230, a tunnel insulating layer 235, and a channel layer 237 may be sequentially formed along the surfaces of the drain-side hole 225D, the source-side hole 225S and the pipe trench 213 to form a preliminary through structure 241a. Kinds and shapes of material layers constituting the preliminary through structure 241a may be the same as those described with reference to FIG. 3A. When a central region of the channel layer 237 is opened, the opened central region of the channel layer 237 may be filled with an insulating layer 239.

Figure 6C:
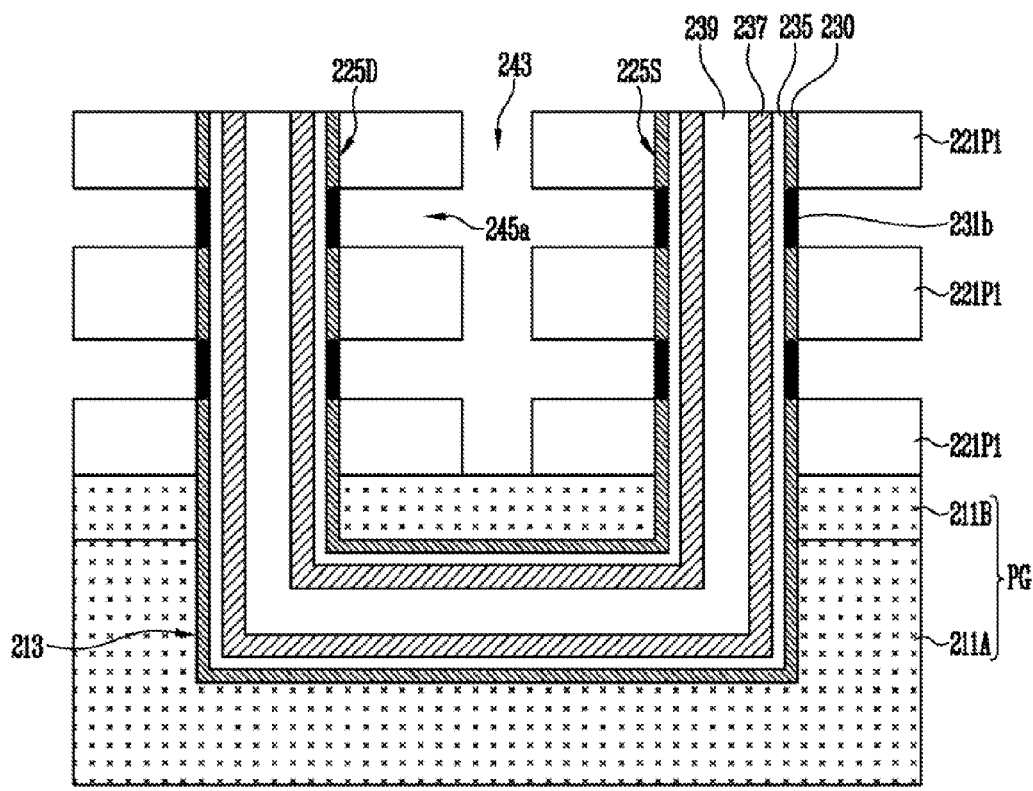

Referring to FIG. 6C, the interlayer insulating layers 221 and the sacrificial layers 223 interposed between the drain-side hole 225D and the source-side hole 225S may be etched to form a slit 243 through the interlayer insulating layers 221 and the sacrificial layers 223. Due to the slit 243, a line-shaped preliminary interlayer insulating pattern 221P1 may be defined, and the sacrificial layers 223 may be exposed.

Subsequently, as described above with reference to FIG. 3C, the sacrificial layers 223 may be selectively removed to form preliminary recess regions 245a, and partial regions of the preliminary layer 230 exposed through the preliminary recess regions 245a may be firstly processed to form trap regions 231b in partial regions of the preliminary layer 230. The first processing process may include nitriding the preliminary layer 230. The first processing process may be controlled so that partial regions of the preliminary layer 230, which are not firstly processed, remain as non-trap regions between the trap regions 231b, and the preliminary layer 230 disposed within the pipe trench 213 is not firstly processed but remain as a non-trap region.

Figure 6D:
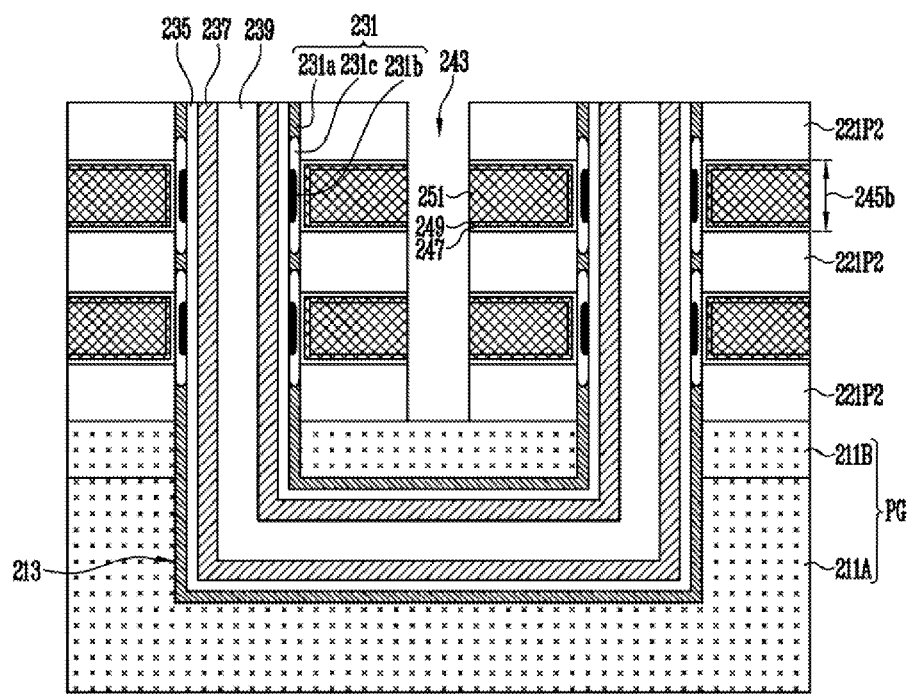

Referring to FIG. 6D, as described above with reference to FIG. 3D, a portion of each of the preliminary interlayer insulating patterns 221P1 may be etched so that interlayer insulating patterns 221P2 having a smaller thickness than thicknesses of the preliminary interlayer insulating patterns 221P1 may be formed. Thus, recess regions 245b having a greater width than widths of the preliminary recess regions 245a may be defined between the interlayer insulating patterns 221P2.

Thereafter, as described above with reference to FIG. 3E, portions of the trap regions 231b exposed through the recess regions 245b and non-trap regions of the preliminary layer 230 adjacent to the trap regions 231b may be secondly processed. As a result, blocking regions 231c in contact with the trap regions 231b may be formed. The second processing process may include an oxidation process as described above with reference to FIG. 3E. The second processing process may be controlled so that the preliminary layer 230 disposed within the pipe trench 213 remains not secondly processed. As a result, the preliminary layer 230 disposed within the pipe trench 213 may not undergo either the first processing process or the second processing process but remain as a sacrificial region 231a formed of a silicon layer.

Subsequently, as described above with reference to FIG. 3F, a blocking insulating layer 247, a barrier layer 249, and a conductive pattern 251 may be formed in each of the recess regions 245b. Thereafter, a known subsequent process, for example, a process of filling the slit 243 with an insulating material, may be performed.

As described above, in the exemplary embodiment, the trap regions 231b may be separated into cells as in the exemplary embodiment, and interfaces may not be formed between the trap regions 231b and the blocking regions 231c. Accordingly, in the exemplary embodiment, the transport of charges between memory cells and the trapping of charges at interfaces between layers may be reduced.

Furthermore, in the exemplary embodiment, the trap regions 231b may be prevented from being formed in the pipe transistor so that the trapping of charges in the pipe transistor may be reduced. Also, the sacrificial regions 231a formed of silicon may be connected to the pipe gate PG, thereby reducing a driving voltage of the pipe transistor.

Figure 7:
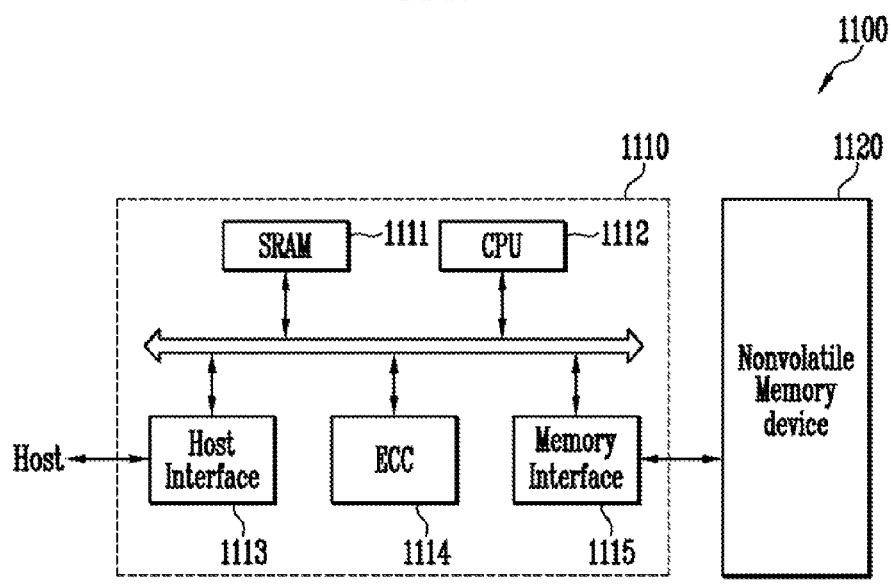
FIG. 7 is a construction diagram of a memory system according to an exemplary embodiment of the present invention.

FIG. 7 is a construction diagram of a memory system 1100 according to an exemplary embodiment of the present invention.

Referring to FIG. 7, the memory system 1100 according to the exemplary embodiment of the present invention may include a nonvolatile memory device 1120 and a memory controller 1110.

The nonvolatile memory device 1120 may include a semiconductor device described in the foregoing embodiments with reference to FIGS. 1 through 6D. Also, the nonvolatile memory device 1120 may be a multi-chip package including a plurality of flash memory chips.

The memory controller 1110 may control the nonvolatile memory device 1120 and include a static random access memory (SRAM) 1111, a central processing unit (CPU) 1112, a host interface 1113, an error correction code (ECC) 1114, and a memory interface 1115. The SRAM 1111 may be used as an operation memory of the CPU 1112, and the CPU 1112 may perform general control operations for exchanging data of the memory controller 1110. The host interface 1113 may include a data exchange protocol of a host connected to the memory system 1100. Also, the ECC 1114 may detect and correct errors included in data read from the nonvolatile memory device 1120, and the memory interface 1115 may interface with the nonvolatile memory device 1120. In addition, the memory controller 1110 may further include a read-only memory (ROM) that may store code data required to interface with the host.

The memory system 1100 having the above-described construction may be a memory card or a solid-state disk (SSD) in which the nonvolatile memory device 1120 is combined with the controller 1110. For instance, when the memory system 1100 is an SSD, the memory controller 1110 may communicate with the outside (e.g., the host) through one of various interface protocols, such as a universal serial bus (USB), a multimedia card (MMC), peripheral component interface-express (PCI-E), serial advanced technology attachment (SATA), parallel-ATA (PATA), a small computer system interface (SCSI), an enhanced small device interface (ESDI), and an integrated drive electronics (IDE).

Figure 8:
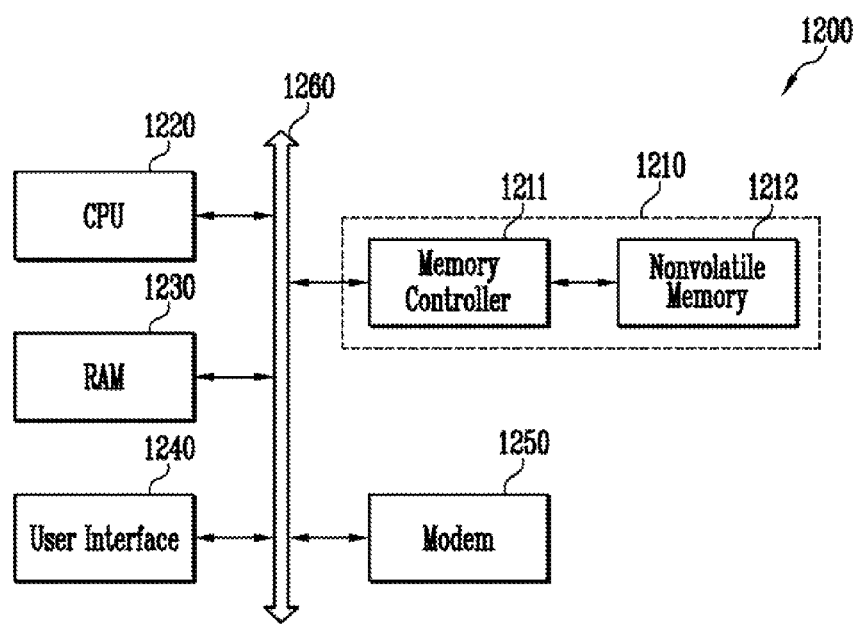
FIG. 8 is a construction diagram of a computing system according to an exemplary embodiment of the present invention.

FIG. 8 is a construction diagram of a computing system 1200 according to an exemplary embodiment of the present invention.

Referring to FIG. 8, the computing system 1200 according to the exemplary embodiment of the present invention may include a CPU 1220, an RAM 1230, a user interface 1240, a modem 1250, and a memory system 1210, which may be electrically connected to a system bus 1260. Also, when the computing system 1200 is a mobile device, the computing system 1200 may further include a battery that may supply an operation voltage to the computing system 1200. Also, the computing system 1200 may further include an application chipset, a camera image processor (CIS), and a mobile dynamic RAM (mobile DRAM).

As described above with reference to FIG. 7, the memory system 1210 may include a nonvolatile memory 1212 and a memory controller 1211.

According to the present disclosure, partial regions of a preliminary layer may be opened to define trap regions, and partial regions of the preliminary layer in contact with the trap regions may be defined as blocking regions. As a result, in the present disclosure, since the trap regions may be separated into respective cells by blocking regions, the transport of charges between memory cells may be prevented, thereby improving reliability of semiconductor memory devices.

Furthermore, according to the present disclosure, since partial regions of a preliminary layer may be defined as trap regions and blocking regions to form a multifunctional layer, interfaces between the trap regions and the blocking regions are not formed. Accordingly, in the present disclosure, concerns regarding degradation of reliability of semiconductor memory devices due to charges trapped at the interfaces between the trap regions and the blocking regions may be alleviated.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a semiconductor memory device, the method comprising:
    alternately stacking interlayer insulating layers and sacrificial layers;
    forming holes through the interlayer insulating layers and the sacrificial layers;
    forming a preliminary layer, a tunnel insulating layer, and a channel layer within each of the holes;
    forming a slit between the holes through the interlayer insulating layers and the sacrificial layers;
    removing the sacrificial layers exposed through the slit to form recess regions;
    firstly processing the preliminary layer exposed through the recess regions, thereby defining trap regions in partial regions of the preliminary layer;
    secondly processing the preliminary layer disposed around the trap regions, thereby defining blocking regions contacting the trap regions, in partial regions of the preliminary layer; and
    forming conductive patterns within the recess regions.

2. The method of claim 1, wherein the preliminary layer includes a silicon layer.

3. The method of claim 1, wherein the first processing of the preliminary layer includes nitriding the partial regions of the preliminary layer exposed through the recess regions.

4. The method of claim 1, wherein the second processing of the preliminary layer includes oxidizing a portion of the trap regions and oxidizing partial regions of the preliminary layer, adjacent to the trap regions.

5. The method of claim 1, before the defining of the blocking regions, further comprising
    etching the interlayer insulating layers and increasing widths of the recess regions so that regions of the preliminary layer adjacent to the trap regions are exposed.

6. The method of claim 1, wherein, during the alternately stacking of the interlayer insulating layers and the sacrificial layers, each of the interlayer insulating layers is formed to have a greater thickness than that of each of the sacrificial layers.

7. The method of claim 1, before the alternately stacking of the interlayer insulating layers and the sacrificial layers, further comprising:
   forming a pipe gate in a semiconductor substrate;
   etching the pipe gate to form a pipe trench; and
   filling the pipe trench with a sacrificial layer.

8. The method of claim 4, wherein during the oxidization process, the partial regions of the preliminary layer other than the trap regions are oxidized more rapidly than the trap regions of the preliminary layer.

9. The method of claim 4, wherein the oxidization process is controlled so that portions of the trap regions and the entirety of the channel layer remain not oxidized.

10. The method of claim 4, wherein the oxidization process is controlled so that partial regions of the preliminary layer, between the trap regions, remain not oxidized.

11. The method of claim 7, before the forming of the preliminary layer, the tunnel insulating layer, and the channel layer, further comprising removing the sacrificial layer formed within the pipe trench, and during the forming of the preliminary layer, the tunnel insulating layer, and the channel layer the preliminary layer, the tunnel insulating layer, and the channel layer are also formed within the pipe trench.

12. The method of claim 11, wherein the firstly processing and secondly processing of the preliminary layer is controlled so that partial regions of the preliminary layer, formed within the pipe trench, remain not defined by the trap regions or the blocking regions.

* * * * *